Oct. 6, 1959 R. E. SLACK 2,907,926

ELECTRICAL CIRCUIT ASSEMBLY

Filed Dec. 9, 1955 4 Sheets-Sheet 1

*INVENTOR.*
ROBERT E. SLACK

*BY*

Dewey J. Cunningham
ATTORNEY

INVENTOR.
ROBERT E. SLACK
BY
Dewey J. Cunningham
ATTORNEY

Oct. 6, 1959 R. E. SLACK 2,907,926

ELECTRICAL CIRCUIT ASSEMBLY

Filed Dec. 9, 1955 4 Sheets-Sheet 3

INVENTOR.
ROBERT E. SLACK

BY

Dewey J. Cunningham

ATTORNEY

Oct. 6, 1959 R. E. SLACK 2,907,926

ELECTRICAL CIRCUIT ASSEMBLY

Filed Dec. 9, 1955 4 Sheets-Sheet 4

INVENTOR.
ROBERT E. SLACK
BY
[signature]
ATTORNEY

United States Patent Office 2,907,926

Patented Oct. 6, 1959

2,907,926

ELECTRICAL CIRCUIT ASSEMBLY

Robert E. Slack, Johnson City, N.Y., assignor to International Business Machines Corporation, New York, N.Y., a corporation of New York Application December 9, 1955, Serial No. 552,004

10 Claims. (Cl. 317—101)

The present invention relates to electrical assemblies and particularly to an assembly which may be mass produced by known techniques and one which is capable of housing a large number of associated circuit components in a relatively small space with a minimum of weight.

An object of this invention is to provide an improved means for packaging an electrical circuit assembly.

Another object of this invention is to provide an improved means for housing an electrical circuit assembly in which interchangeability of the parts thereof is fully realized.

Still another object of the invention is to furnish improved means for packaging electrical circuit assemblies in which all circuit connections may be made either by dip soldering techniques or pluggable connections, thereby eliminating time-consuming hand soldering operations.

A further object of this invention is to provide an improved packaging arrangement as described above in which those heat dissipative components which require cooling may be cooled by means externally applied to the assembly.

Still further, it is an object of the present invention to provide improved means for economically housing large and complex electrical circuits with minimum space and weight.

Briefly, the invention comprises one or more electrical unit assemblies which may be electrically associated by means of pluggable type connections. Each unit assembly comprises a plurality of metallized circuit boards which have metallized conductors on one or both sides thereof. Each board has a plurality of separate spaced apart metallized conductors near the peripheral edges thereof which make connection from one side of the board to the other. Other metallized conductors may be provided for connecting certain of the edge conductors together or to terminals somewhere on the board. These terminals may be of any suitable design and are illustrated herein as being of the "plated hole" type. Various types of electrical components may be connected to appropriate ones of said terminals by dip soldering techniques. Those electrical components which dissipate sufficient heat to require cooling may be mounted to contact a heat sink which is in the form of a metallized area of the card used primarily for heat conduction. These heat sinks may also serve as the electrical ground connection for the assembly. The circuit boards which form an assembly are separated by spacers which are provided with a plurality of separate spaced apart metallized conductors thereon. The spacers on two sides of the assembly have a rectangular cross section and a plurality of metallized conductors, each of which is adapted to extend from one side of the spacer which engages one board, around the side of the spacer between the boards, and on to the side which engages an adjacent board. The portion of the conductor on the side of the spacer between the boards is slanted such that the portions of the conductor on the sides of the spacer which engage adjacent boards are vertically spaced apart, as shown in the drawings. This arrangement affords interchangeability of the spacers for these two sides of the assembly, as well as interchangeability of similar component boards within the same unit. The spacers for the other two sides of the assembly, i.e., the top and bottom sides are also of a rectangular cross section and may be identical with those described above. If the slanting feature is not needed it may be dispensed with and instead all of the portions of each metallized conductor on the sides of the spacer may be in the same general plane. The boards and spacers of an assembly are adapted to be held together by a plurality of suitable rods. The entire assembly may thereafter be dip soldered to assure good electrical contact between the spacers and the boards.

Other objects of the invention will be pointed out in the following description and claims and illustrated in the accompanying drawings, which disclose, by way of examples, the principle of the invention and the best mode, which has been contemplated, of applying that principle.

In the drawings.

Similar reference numerals represent similar parts throughout the several views.

Figure 1:
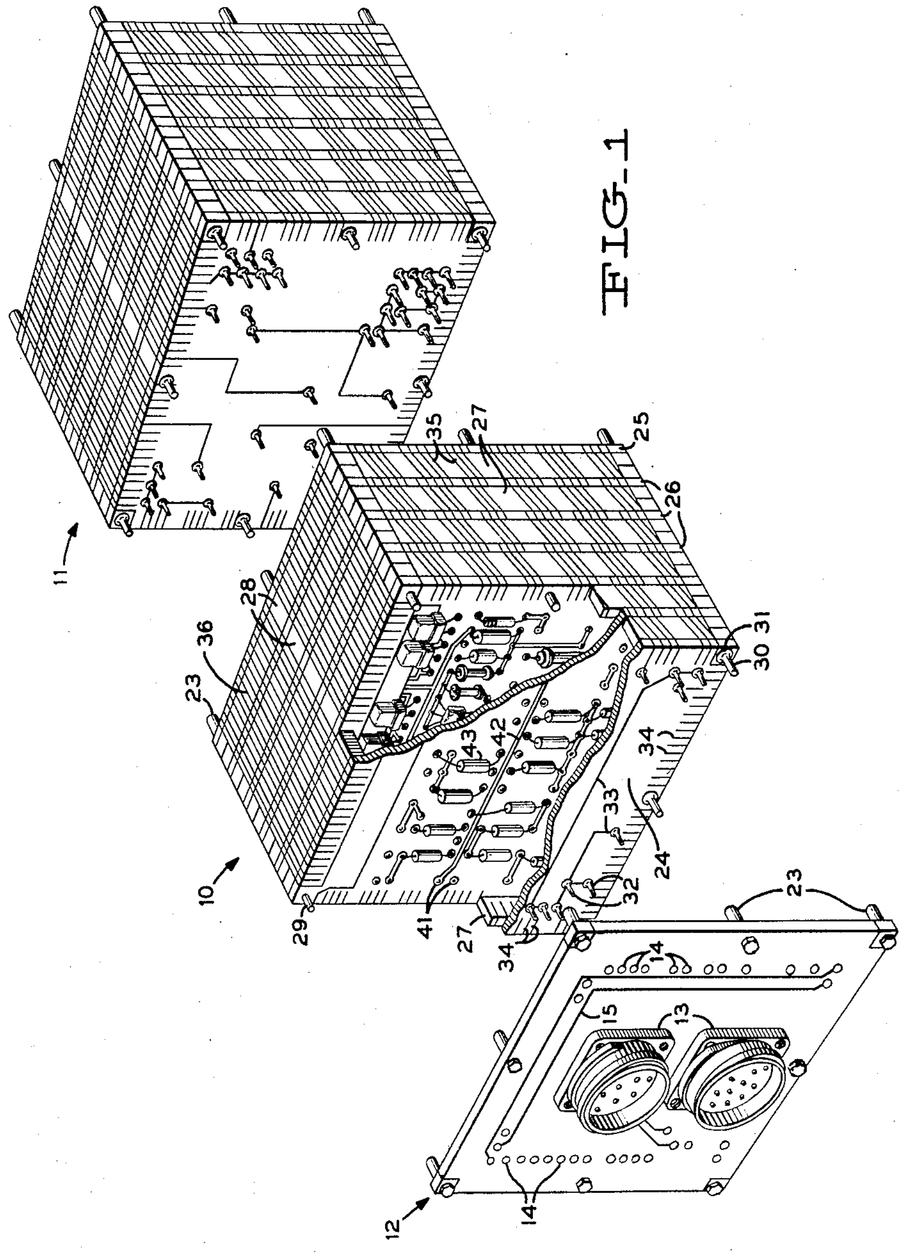
Fig. 1 is a perspective view of the present invention with portions thereof being broken away for clarity. Other portions are shown in exploded fashion so that the association thereof may be seen.
Figure 3:
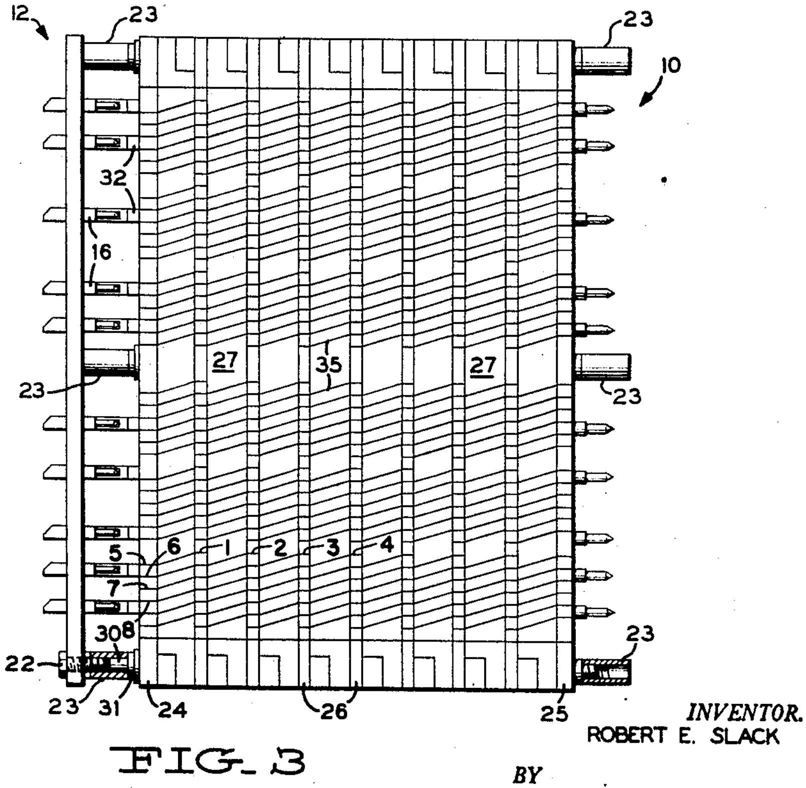
Fig. 3 is a side elevation of one unit assembly showing its association with a terminal board to which the electrical connections for the assembly may be made.

Referring now to Fig. 1, a plurality of electrical circuit assemblies 10 and 11 are shown. Portions of assembly 10 are broken away to more clearly show the internal structure thereof. A main terminal board or plate 12, which may be constructed of suitable insulating material, is provided to which the assembly 10 is adapted to be pluggably connected as illustrated in Fig. 3. The front side of the terminal plate may be used to support one or more connectors as illustrated by reference numeral 13. These connectors may be secured to the terminal plate by any convenient means. Around the outer periphery of the board a plurality of apertures 14 are furnished which are adapted to receive pins 16, as shown in Fig. 3. The pins may be secured to the terminal board by a press fit or other suitable means. Certain of the pins may be interconnected by metallized conductors such as that illustrated by reference numeral 15. A metallized conductor as used herein is one produced by any one of a number of well-known processes and is often known as a "printed" conductor.

Figure 2:
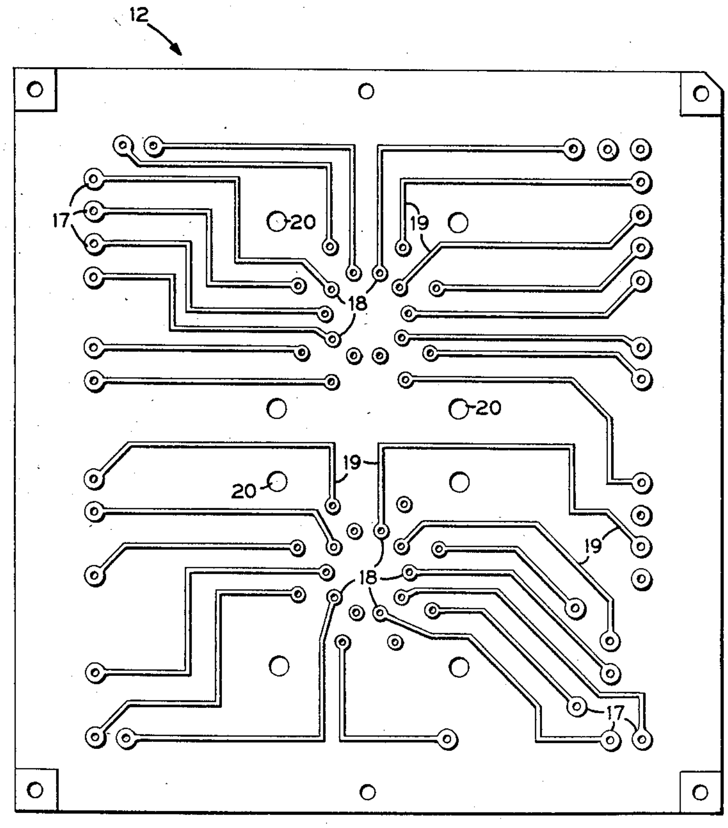
Fig. 2 shows a plan view of the back of a typical terminal board.

Referring now to Fig. 2, there is shown the rear of the terminal board 12. It comprises a plurality of terminals 17 which are aligned with the apertures 14 previously described and are adapted to make electrical contact with pins 16, such contact being obtained easily by dip soldering methods. Two arrays of terminals 18 are arranged centrally on the board and are adapted to be connected to terminals 17 by metallized conductors 19. The terminals 18 are adapted to be electrically connected to the connectors 13 by any suitable means. For example, pins may extend through apertures centrally of terminals 18 and be pluggably received by connectors 13. The apertures 20 on the board 12 may be used to receive permanent fastening means for connectors 13.

From the above it will be seen that leads which are connected to connectors 13 are now in electrical contact with the pins 16 at the outer periphery of the terminal board.

As illustrated in Figs. 1 through 3, the main terminal plate is provided with a plurality of apertures at the corners thereof, as well as at points between each pair of corners, which are adapted to receive stud bolts 22. One end of a sleeve 23 is arranged to threadingly receive one end of bolt 22 and to be secured thereto. The other end of the sleeve is not provided with internal threads and is adapted to be used for pluggable connection with the unit assembly 10.

The unit assembly 10 comprises end boards 24 and 25 and a plurality of component boards therebetween, the latter boards being illustrated by reference numeral 26. All of these boards are adapted to be separated by side spacers 27 and top and bottom spacers 28. The end boards and the component boards are provided with apertures along the edges thereof similar to those in the main terminal plate 12 for receiving rods 29 which are adapted to secure the boards together. One end of the rod has a smooth end portion 30 which is adapted to be received by one end of sleeves 23 on the main terminal plate 12. A flange 31 is provided adjacent this end portion for engagement with the end board. The other end of the rods are adapted to receive the sleeve connectors 23, identical with those previously illustrated by the same reference numeral, for securing the boards together.

The end board 24 is provided with a plurality of female plugs 32 which are adapted to receive the male plugs or pins 16 on the main terminal plate 12. These female plugs may be connected by means of appropriate metallized wiring, such as that illustrated by reference numeral 33, to each other or to a plurality of edge conductors 34 which are located around the periphery of the end board. It will be seen that the remaining of the circuit boards are provided with similarly situated edge conductors. These edge conductors for each board are adapted to be associated with the edge conductors of other boards by means of conductors which are provided on spacers 27 and 28 which are used for separating the boards from each other. As shown in the drawing the conductors 35 on the spacers 27 are provided with a portion which is adapted to engage or abut an edge conductor on the board, a portion which extends in slanted fashion along the outer side of the spacer, and a portion which is adapted to engage one of the edge conductors on an adjacent board. Thus, it will be seen that an edge conductor on the end board 24 is connected to the next higher edge conductor on the adjacent component board 26. While the use of the wrap-around edge conductors offer certain advantages, it will be appreciated that the most important thing is that a connection be afforded from that portion of an edge conductor on one side of the board to the other portion on the other side of the board. This could be afforded by plated holes or other types of conductors. The expression "edge conductor" is meant to include some form of conductor adjacent the peripheral edge of the board but not necessarily one which passes around the outside edge of the board between two sides thereof. Also, an edge conductor may be one which is only at said outside edge as long as the proper connections are made to the circuits on the boards. Here, solder connections would serve to connect these edge conductors to the spacer conductors.

Figure 4:
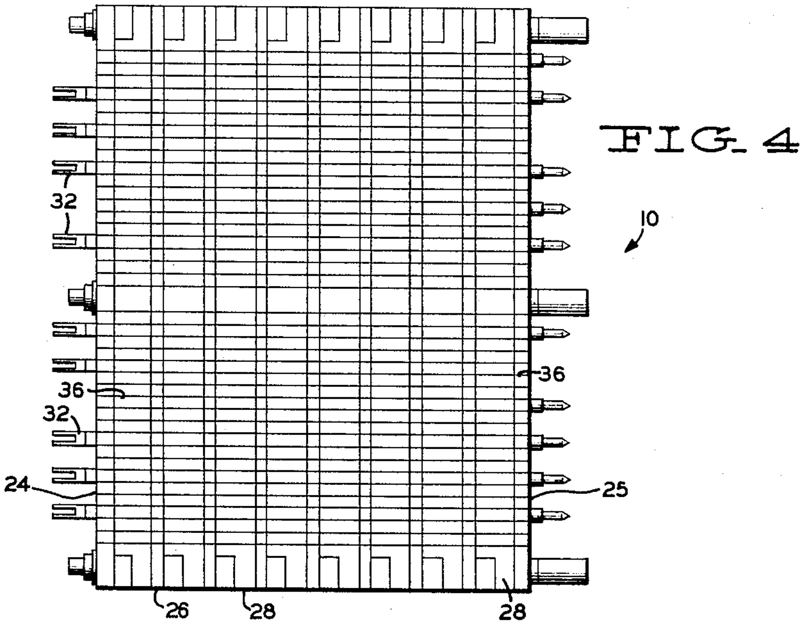
Fig. 4 is a top plan view of Fig. 3.

Referring now to the top plan view of the unit assembly 10 which is shown in Fig. 4, it will be seen that the top spacer 28 is provided with conductors 36. These conductors differ, in the embodiment shown, from the conductors 35 on the side spacers 27 in that the portions thereof on the three sides of the spacers are in the same general plane. That is, they do not have the slanted feature such as that used on the side spacers. Conductors 35 are useful in serving as conducting paths between the front and back boards of an assembly.

Figure 5:
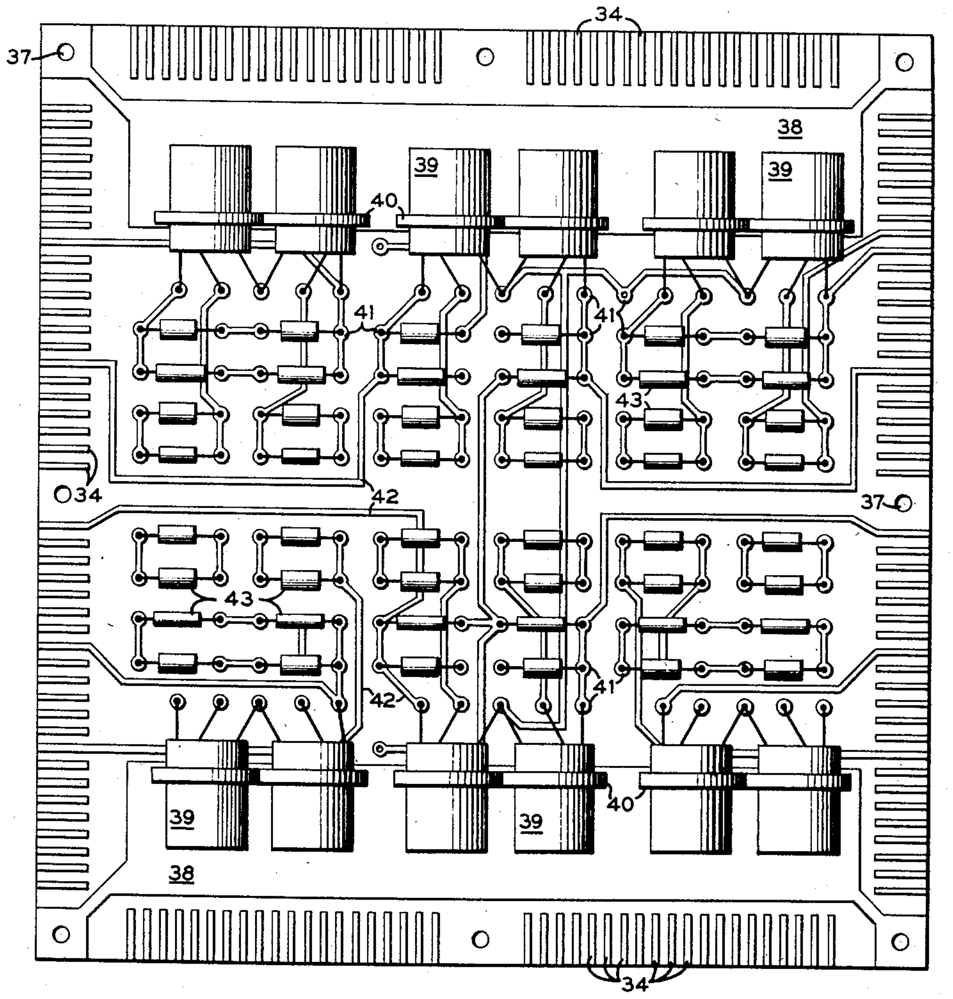
Fig. 5 is a front view of a typical metallized circuit component board.

Referring now to Fig. 5, a typical metallized circuit component board 26 is illustrated. It will be seen that the wrap-around edge conductors are provided on all sides thereof and those on the same side are parallel with each other. Apertures 37 are provided as illustrated and are adapted to receive rods 29 for securing a plurality of the boards together to form a unitary assembly. In order that the heat dissipative components on a board which require cooling may be cooled, a heat sink is furnished upon which these components may be mounted. The heat sinks are illustrated by reference numeral 38 and may be easily provided by metallized circuit techniques. That is, the entire area 38 may be a portion of the copper foil which was originally on the plate but which is not etched away in forming the metallized circuit conductors on the plate. It will be seen that each sink extends over to two corners of the board so that the heat sinks of adjacent boards may be associated in intimate contact with each other through metallized portions at the ends of spacers 27 and 28. Those heat dissipative components which require cooling have been illustrated in the present instance by reference numeral 39. For example, these components may be transistors which are pressed against the heat sink 38 and secured thereto by means of clips 40 which wrap around the transistors. The clips may be soldered or otherwise connected to the heat sink. As illustrated in Fig. 5, a plurality of terminals 41 are adapted to be associated with each other or with the edge conductors 34 by means of suitable metallized conductors 42. Additionally, various circuit components such as resistors, capacitors and inductors may be connected to certain ones of terminals 41. These various components have been illustrated by reference numeral 43. These components may be secured to the metallized conductors and terminal by any of a number of conventional techniques. One technique used is to perforate the center of the terminal, plate the walls of the perforation, insert the terminal lead and dip solder the lead in place. It will be apparent that the component lead may thus make electrical contact with one or both sides of the board upon which it is mounted.

After the boards and spacers of an assembly have been secured together by means of rods 29 and sleeves 23, it may be desirable to dip solder the entire assembly. This, of course, tends to assure reliable contact between the edge conductors on the boards and their associated spacer conductors.

It will be apparent that the metallized conductors may be above the surface of the insulating support upon which they are mounted or they may be flush with the surface. In the latter case the dip soldering operation assures the proper connection between the edge conductors and spacer conductors.

It is also within the scope of the present invention for that portion of the conductor which wraps around the edge to fit within a notch along the edge. This would allow a reservoir for receiving solder during the final dip soldering operation so that good electrical conduction is established between the edge conductors and the spacer conductors. This is particularly true since now the solder within the reservoir will have a larger area of contact with the conductors on the sides of the spacers. It is further within the scope of this invention to position the spacers slightly inwardly or outwardly of the edges of the boards. This also affords greater contact area for the dip soldering operation.

Figure 6:
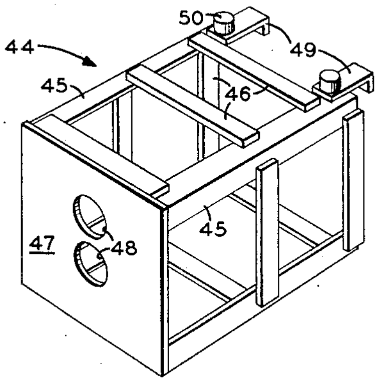
Fig. 6 shows a frame assembly which might be used for housing one or more electrical assemblies.

Referring now to Fig. 6, a framework 44 is illustrated for receiving the assembly shown in Fig. 1. This framework comprises a plurality of angle members 45 which are associated in the manner shown and are connected by a plurality of cross pieces 46. A back plate 47 is adapted to be connected by suitable means to the angle members 45 and serve to receive the multi-terminal connectors 13.

As illustrated, apertures 48 are shown in the back plate to receive connectors 13.

This assembly which is shown in Fig. 1 is adapted to be received by the framework 44 and the angle members 45 are adapted to engage the portions of the heat sinks which extend out to the corners of the boards which make up each assembly. In this manner, cooling of the angle members 45 will serve to cool the heat sinks 38. So that the assembly shown in Fig. 1 may be held within the framework 44, angular members 49 are shown to be connected to each of the angular members 45 by means of stud bolts 50.

From the above-detailed description it will be apparent that there has been provided a new and improved means of packaging electrical assemblies. The present invention affords complete automation of the manufacture of the assemblies by utilizing known metallized circuit and dip soldering techniques. With the wrap-around metallized conductors on the individual circuit boards 24, 25 and 26 in combination with the slanted line conductors 35 provided on the spacers 27 between the boards, it is possible to achieve standardization on identical circuit assemblies. By this it is meant that where identical circuits are provided on a plurality of the boards in the same assembly, the circuit input and output points may be connected to the same edge conductors on the board. By using the slant line feature it is possible to reach the same edge conductor or each board by different conductive paths. This affords complete interchangeability of identical circuit assemblies. For example, referring to Fig. 3, let it be assumed that each of the first four of the printed circuit boards 26 to the right of the front circuit board 24 are to contain the same components connected in the same operative relationship. Assume further that for purposes of standardization it is desirable that every one of these printed circuit boards be identical in every respect and completely interchangeable. If one of the input terminals to the first of the boards 26 to the right of the front board 24 is identified by reference numeral 1, then the reference numerals 2, 3 and 4 on the next three boards will be similarly situated and serve as the input terminals for their respective boards. By using the slanted conductors 35 on the edge of the spacers 27, shown in Fig. 3, it is possible to reach each of the similarly situated edge conductors 1, 2, 3 and 4 from the conductors 5, 6, 7 and 8, respectively, on the front board 24. This would not be possible without the slant line feature on spacers 27. Without this feature, the input and output points on similar circuit boards would have to be different for every board. The slanted line feature also allows more circuit elements and connections to be placed on a single component board and in addition permits a larger number of boards to be mounted in a single assembly.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. In an electrical circuit assembly, a plurality of individual boards mounted in stacked relation, said boards being of insulating material and each having metallized conductors thereon which form a part of said electrical circuit assembly, each board also having a plurality of similarly situated edge conductors thereon, said metallized conductors being electrically connected to certain of said edge conductors, and conductor means connecting the edge conductors on one board with differently situated edge conductors on an adjacent board.

2. An electrical circuit assembly comprising a plurality of circuit component boards of insulating material mounted in a stacked arrangement, each of said boards having a plurality of edge conductors spaced from one another along an edge of the board and extending from one side of the board around the edge and onto the other side of the board, said boards having metallized circuit conductors and associated circuit components thereon which are in circuit with each other and with certain ones of the edge conductors, spacer means between adjacent boards, said spacer means having metallized conductors thereon which make electrical contact between the edge conductors on one board and differently situated edge conductors on an adjacent board, and means for securing said boards and spacers together to form an integral assembly.

3. An electrical circuit assembly comprising a plurality of insulated circuit component boards mounted in stacked spaced relation, spacer means between adjacent boards near the edges thereof in engagement with said boards and arranged to maintain said boards in spaced relation, metallized circuits on said boards having electrical components connected thereto, the components being positioned between the board on which they are mounted and the board adjacent thereto, a group of separate metallized conductors along the edges of said boards and a group of separate metallized conductors along the edges of said spacer means, individual ones of the group of conductors on said boards being electrically connected to individual ones of the group of conductors on said spacer means, certain of the metallized conductors on said spacer means being slanted so that the edge conductors on one board are connected to differently situated edge conductors on an adjacent board, certain of the electrically associated conductors on the edges of said boards and said spacer means being electrically connected to the electrical circuits and associated components on said boards.

4. In an electrical circuit assembly, a plurality of individual boards of insulating material each having metallized conductors and associated electrical components thereon which form a part of said electrical circuit assembly, spacer means between adjacent boards near the edges thereof, a plurality of separate conductors on said spacer means, a plurality of conductor means adjacent the edges of each of said boards which lie in separate general parallel planes, certain of the conductor means being connected to the metallized conductors on said boards and to certain of the conductors on said spacer means, the conductors on said spacer means being slanted to afford electrical connection between conductor means in different general planes on different boards, and means for securing said boards and spacers together to form an integral assembly.

5. In an electrical circuit assembly a plurality of circuit boards of insulating material mounted in stacked relation relative to each other, spacer means positioned along certain edges of adjacent boards for separating the boards from one another, a plurality of similarly situated edge conductors along said certain edges of said boards, metallized circuits on said boards in circuit with certain of the edge conductors on said boards, the edge conductors on the same board being spaced from one another along the edge on which they are positioned and extending from one side of the board around the edge of the board to the other side of the board, conductor means on said spacer means positioned to make an electrical circuit from the edge conductors on one board to differently positioned edge conductors on an adjacent board, and means for securing said boards and spacers together to form an integral circuit assembly.

6. In an electrical circuit assembly, a plurality of circuit boards of insulating material mounted in stacked relation, spacer means positioned adjacent at least two edges of adjacent boards for separating the boards from one another, a plurality of similarly situated conductor means adjacent the edges of each board which extend from one side of the board to the other, metallized circuits and associated circuit components on said boards in circuit with certain of the conductor means on said boards, and metallized conductors on said spacer means positioned to make an electrical circuit from the conductor means on one board to differently positioned conductor means on an adjacent board.

7. In an electrical circuit assembly, a stack of individual boards of insulating material each having metallized conductors thereon which form a part of said electrical circuit assembly, each board also having a plurality of similarly situated edge conductors thereon, said metallized conductors being electrically connected to certain of said edge conductors, and spacer means between adjacent boards near the edges thereof having conductors thereon which afford electrical conduction from the edge ocnductors on one board to differently situated edge conductors on an adjacent board.

8. In an electrical circuit assembly, a stack of individual boards of insulating material each having metallized conductors thereon which form a part of said electrical circuit assembly, each board also having a plurality of similarly situated edge conductors which provide conductive paths from one side of the board to the other, said metallized conductors being electrically connected to certain of said edge conductors, and spacer means between adjacent boards near the edges thereof having conductors thereon which afford electrical conduction from the edge conductors on one board to differently situated edge conductors on an adjacent board.

9. In an electrical circuit assembly, a stack of individual boards of insulating material each having metallized electrical conductors thereon which form a part of said electrical circuit assembly, metallized heat conductor means on certain of said boards in engagement with predetermined ones of the heat dissipative components associated with said metallized electrical conductors, each board also having a plurality of similarly situated edge conductors thereon, said metallized electrical conductors being electrically connected to certain of said edge conductors, and conductor means connecting the edge conductors on one board with differently situated edge conductors on an adjacent board.

10. An electrical circuit assembly comprising a plurality of circuit component boards, each of said boards being of an insulating material and having a plurality of edge conductors spaced from one another along an edge of the board and extending from one side of the board around the edge and onto the other side of the board, said boards having metallized circuit conductors and associated circuit components thereon which are in circuit with each other and with certain ones of the edge conductors, metallized heat sink means on certain of said boards adapted to have certain of said circuit components mounted thereon for dissipating the heat generated by said certain circuit components to the edges of said certain boards, spacer means between adjacent boards, said spacer means having metallized conductors thereon which make electrical contact between the edge conductors on one board and differently situated edge conductors on an adjacent board, and means for securing said boards and spacers together in a stacked arrangement to form an integral assembly.

References Cited in the file of this patent

UNITED STATES PATENTS

| | | |
|---|---|---|
| 2,611,807 | Lazzery | Sept. 23, 1952 |
| 2,634,310 | Eisler | Apr. 7, 1953 |
| 2,706,697 | Eisler | Apr. 19, 1955 |
| 2,752,537 | Wolfe | Jan. 26, 1956 |
| 2,803,788 | Sanders | Aug. 20, 1957 |

FOREIGN PATENTS

| | | |
|---|---|---|
| 223,402 | Great Britain | Dec. 21, 1923 |